(12) United States Patent
Patel et al.

(10) Patent No.: US 9,939,492 B2
(45) Date of Patent: Apr. 10, 2018

(54) ELECTRIC MOTOR PROTECTION USING A VIRTUAL SPEED SWITCH

(71) Applicant: Schweitzer Engineering Laboratories, Inc., Pullman, WA (US)

(72) Inventors: Subhash C. Patel, West Chester, PA (US); George E. Alexander, Wallingford, PA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 307 days.

(21) Appl. No.: 14/710,796

(22) Filed: May 13, 2015

(65) Prior Publication Data

US 2016/0334468 A1    Nov. 17, 2016

(51) Int. Cl.
*G01R 31/02* (2006.01)
*G01R 27/28* (2006.01)
*G01R 31/34* (2006.01)

(52) U.S. Cl.
CPC ................ *G01R 31/343* (2013.01)

(58) Field of Classification Search
USPC .................... 324/539, 652, 765.01
See application file for complete search history.

(56) References Cited

U.S. PATENT DOCUMENTS

| | | | |
|---|---|---|---|
| 8,725,451 B2 | 5/2014 | Whitefield | |
| 9,176,024 B2 | 11/2015 | Jensen | |
| 2004/0156152 A1* | 8/2004 | Kalender | G01R 31/343 361/23 |
| 2005/0212548 A1* | 9/2005 | Kim | H02P 6/12 324/765.01 |
| 2014/0368956 A1* | 12/2014 | Perra | H02H 1/0092 702/58 |

OTHER PUBLICATIONS

Borim, Thiago Leite, et al., Benefits of Monitoring the Rotor Electrical Quantities and Transmitting by Wireless Communication, Presented at IEEE 2015 Petroleum and Chemical Industry Conference, Oct. 2015.

Arebi, Lufti, Gu, J., Ball, Andrew and Gu, Fengshou (2010) Investigation of a Rotating Shaft with a Novel Integrated Wireless Accelerometer. In: The Seventh International Conference on Condition Monitoring and Machinery Failure Prevention Technologies, Jun. 22-24, 2010, Ettington Chase, Stratford-upon-Avon, England, UK.

* cited by examiner

*Primary Examiner* — Farhana Hoque
(74) *Attorney, Agent, or Firm* — Richard M. Edge (57) ABSTRACT

Detection of a locked rotor condition of an electric motor during startup herein uses a virtual speed switch. The methods and systems herein determine whether the motor is in a starting state, and the monitor the motor current to determine if it is greater than a predetermined threshold, and that the motor current decrease exceeds a predetermined threshold after a predetermined amount of time. If the decrease in motor current is not less than a predetermined threshold, then a speed switch bit is set, indicating that the rotor is turning. The methods and systems herein further determine whether a physical speed switch is faulty, and determine a locked rotor condition using the virtual speed switch signal, a physical speed switch signal, and whether the physical speed switch is faulty.

21 Claims, 9 Drawing Sheets

ELECTRIC MOTOR PROTECTION USING A VIRTUAL SPEED SWITCH

RELATED APPLICATION (none)

TECHNICAL FIELD

This disclosure relates to electric motor protection. More particularly, this disclosure relates to detecting a locked rotor condition in an electric motor. This disclosure also relates to detecting a locked rotor condition in an electric motor using a virtual speed switch.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

Three-phase motors are widely used throughout industry to transform electrical energy to mechanical energy which may be used to perform work. Motors are often necessary pieces of equipment for performing numerous industrial tasks from pumping water to processing materials. Because motors are such an integral part of many industries, loss of use of a motor can cause great delays and loss of income while the motor is off line. Therefore, motors are monitored and protected against overcurrent, overheating, locked rotor, and several other conditions which can shorten a motor's productive lifetime, or result in replacement of or maintenance to the motor. Further, the monitoring and protection of motors is carefully controlled such that a motor is not taken off line unless it is indeed experiencing a condition that would warrant such action. For example, motor protection schemes meant to interrupt a motor startup due to a locked rotor condition attempt to determine as accurately as possible the conditions of the rotor. If the schemes are overly conservative, the motor startup would be prematurely stopped, resulting in unnecessary and disruptive downtime. However, if the schemes are overly secure, the motor may experience unnecessary and premature harm due to the locked rotor condition, which may generate damaging overcurrent and/or temperature on the windings of the motor.

Intelligent electronic devices (IEDs) are often used to monitor various aspects of electric motors and provide protection thereto. Using certain values provided by the motor manufacturer as well as the currents and/or voltages supplied to the motor, IEDs can be programmed to determine various conditions of the motor and provide protection to the motor by taking the motor off line when certain conditions are determined to be present in the system. For example, the IED may be programmed to determine the temperature of the rotor and take the motor off line if the temperature exceeds a certain value, or detect a locked rotor condition during startup and take the motor off line if the locked rotor condition persists during startup.

Disclosed herein are several embodiments of apparatuses, systems, and methods for detecting conditions of an electric motor, and providing protection to the electric motor. Specifically, several embodiments described herein provide locked rotor protection to an electric motor using a speed switch input, and in particular a virtual speed switch input.

The embodiments of the disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

In some cases, well-known features, structures or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations.

Several aspects of the embodiments described may be implemented as software modules or components. As used herein, a software module or component may include any type of computer instruction or computer executable code located within a memory device and/or transmitted as electronic signals over a system bus or wired or wireless network. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a non-transitory computer and/or machine-readable medium having stored thereon instructions that may be used to program a computer (or other electronic device) to perform processes described herein. For example, a non-transitory computer-readable medium may store instructions that, when executed by a processor of a computer system, cause the processor to perform certain methods disclosed herein. The non-transitory computer-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of machine-readable media suitable for storing electronic and/or processor executable instructions.

Protection against overheating of the rotor is especially important during the startup of the motor. Certain physical conditions during startup result in the rotor temperature increasing rapidly. Motors typically include a rotor with windings through which an alternating current flows, causing a magnetic field in the rotor windings. The rotor winding may consist of bars parallel to the motor shaft. End rings connect the bars to form a short-circuited assembly. Similarly, the motor typically includes a stator with similar windings and resulting magnetic fields. The magnetic fields cause the rotor to spin. During startup, the magnitude of the current through the windings is much higher than it is at the rated speed of the motor. This increased current causes the temperature in the windings to increase dramatically. When the rotor finally reaches its rated speed, the current flowing through the windings decreases considerably and the temperature slowly decreases as well.

Further, when the rotor is not moving (known as "locked rotor" condition), the frequency of the current, voltage, and magnetic flux in the windings of the rotor is the rated frequency of the power system supplying electric power to the motor (typically near 60 Hz in the US, 50 Hz in Europe). This high frequency results in the majority of the current flowing through the "skin" of the rotor (known as the "deep bar effect"). Because the cross-sectional area of the conductor through which the current flows is effectively decreased, the resistance is increased, resulting in a temperature increase that is more rapid than if the current were flowing through the entire cross-sectional area of the conductor. As the rotor reaches the rated speed the frequency of the current, voltage, and magnetic flux in the windings thereof decreases to the slip at rated speed (relatively low). As the frequency in the rotor decreases, so does the deep bar effect and the resistance of the rotor. Thus, the rate at which heat is produced by the rotor decreases as the rotor approaches its rated speed.

Accordingly, for proper protection of the motor, it is critical to monitor the rotor for a locked rotor condition during startup, when the temperature is increasing at its highest rate. Accurate indication of a locked rotor condition during startup is helpful in providing proper protection during startup.

In some implementations, locked rotor conditions may be determined using an input from a physical speed switch. A physical speed switch is sometimes implemented on an electric motor to detect rotation of the rotor, and output a signal (for example, a speed switch bit) when the rotor is rotating. The signal indicating rotation of the rotor may be used to detect that the motor is not experiencing a locked rotor condition during startup. In practice, however, physical speed switches are generally considered unreliable, even with frequent maintenance. Physical speed switches are often avoided unless specifically necessary, such as on high inertia motor applications.

IEDs may monitor a motor for several different conditions including, for example, overcurrent and thermal conditions. The IED may, therefore, include an overcurrent element module and a thermal element module. The overcurrent element module, thermal element module and a locked rotor module may be coordinated such that the overcurrent module does not trip the motor during startup. In some embodiments, the locked rotor module may have the speed switch output signal as an input. Due to the unreliability of the speed switch, the locked rotor module may likewise be unreliable to provide proper protection during startup.

Figure 1A:
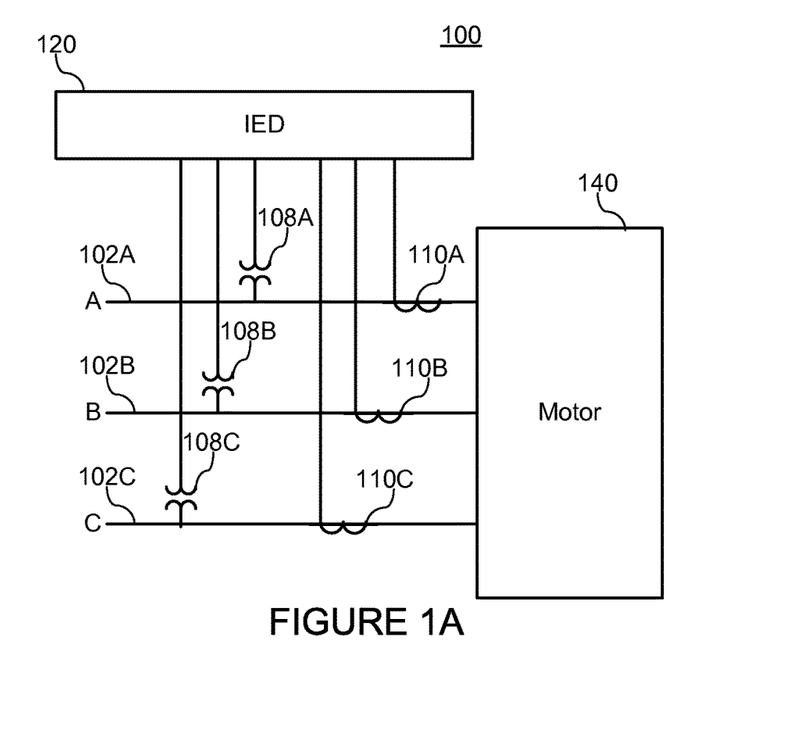
FIG. 1A illustrates a block diagram of a system for protecting an electric motor according to several embodiments described herein.

FIG. 1A illustrates a block diagram of a system 100 including a three-phase motor 140 and a protective IED 120. The motor includes inputs from each phase of electric power 102A, 102B, and 102C. The inputs each include a current transformer 110A, 110B, 110C for providing inputs to the IED representing the currents from each phase to the motor 140. The inputs each may, in some embodiments, also include a potential transformer 108A, 108B, and 108C for proving inputs to the IED representing the voltages of each phase to the motor 140. In certain embodiments, voltage inputs are not available, and not needed. With the current and/or voltage signals from each phase, the IED 120 can monitor various conditions of the motor 140 including the rotor temperature.

Although FIG. 1A illustrates a block diagram of a system 100 including a three-phase motor, the embodiments described herein may apply to single-phase or poly-phase motors. For ease of discussion, however, the embodiments herein are described with reference to three-phase motors.

Figure 1B:
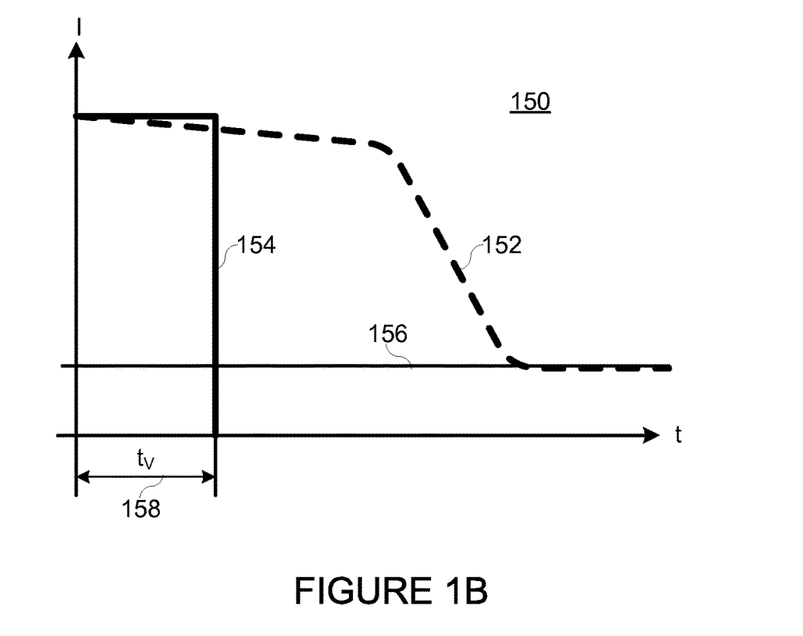
FIG. 1B illustrates plots of current traces for a normal start and a locked rotor start of an electric motor.

FIG. 1B illustrates a plot 150 of a motor current (on the ordinate) over time (on the abscissa) during startup. During a normal startup, as illustrated in trace 152, the current starts at an elevated level, which can be several times the rated full load current 156 of the motor, and slowly decreases until the motor approaches the operating speed. The current then quickly decreases to an operating level at around the rated full load current 156. During a start under locked rotor conditions, as illustrated by trace 154, the current again starts at an elevated level, but because the rotor is in a locked rotor condition, the current remains at the high level. In the illustrated embodiment, a speed switch is used to detect the locked rotor condition, and current is removed from the motor after a predetermined time $t_V$ 158. As briefly indicated above, the IED protecting the motor may include a locked rotor module with a speed switch input. If the speed switch does not signal rotation of the rotor during the predetermined time $t_V$, then the IED determines that a locked rotor condition exists, and trips the circuit breakers to the motor.

However, due to unreliability, the speed switch may fail by outputting a speed switch signal incorrectly, resulting in the motor not being tripped, and possible unnecessary damage thereto. Alternatively, the speed switch may fail to output a speed switch signal, resulting in improper tripping of the motor during a normal startup.

The motor currents used may be any available from the current inputs to the IED from the motor or the terminals thereto. The IED may calculate and use a motor current such as a Root Means Squared (RMS) value of the motor current using all three phases (or the single phase, if a single-phase motor is monitored), or a combination (such as an average) of RMS values from each phase. The IED may calculate and use a symmetrical component of motor current such as, for example, a negative-sequence current, a positive-sequence current, or combinations thereof. The IED may calculate and use a weighted sequence current such as the weighted sequence currents calculated from Equations 1 or 2:

$$I=I_1+5*I_2 \qquad \text{Eq. 1}$$

$$I=I_1+I_2 \qquad \text{Eq. 2}$$

where:
I is the current;
$I_1$ is the positive-sequence current; and,
$I_2$ is the negative-sequence current.

The calculated current may be used to monitor the motor and/or to calculate a virtual speed switch as discussed further herein.

Figure 1C:
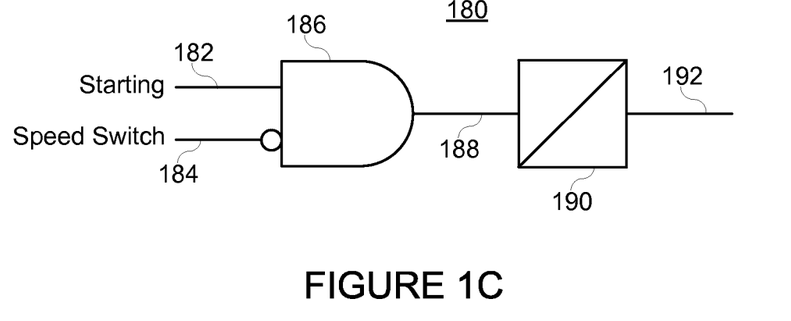
FIG. 1C illustrates a logic diagram for detecting locked rotor using a speed switch.

FIG. 1C illustrates a logic diagram 180 that may be used by a locked rotor module. The locked rotor module may include two inputs, including a starting bit 182 that indicates that the motor is in a starting state, and a speed switch bit 184 that indicates that the rotor is turning when the bit is set. The AND gate 186 may output a signal 188 when both the starting bit 182 is set and the speed switch 184 is not set, indicating that the motor is starting, but the rotor is not turning. The signal 188 may be input to a timer 190, which requires that the signal be present for the predetermined time $t_V$ 158 (FIG. 1B). If the signal 188 persists for the predetermined time $t_V$, then a locked rotor signal 192 may be output from the timer 190. An IED with a locked rotor module such as the logic 180 may signal the circuit breakers feeding the motor to open upon issuance of the locked rotor signal 192, thus removing power from the motor.

In certain embodiments herein, the speed switch signal 184 may be provided by a virtual speed switch. As briefly discussed above, where a motor is implemented with a physical speed switch, a speed switch input 184 from a physical speed switch may be used. However, due to the lack of a physical speed switch on certain motors, as well as the unreliability of speed switches, it may be desirable to use a signal from a virtual speed switch (a virtual speed switch signal) as described herein instead of a signal from a physical speed switch (a physical speed switch signal).

Figure 2:
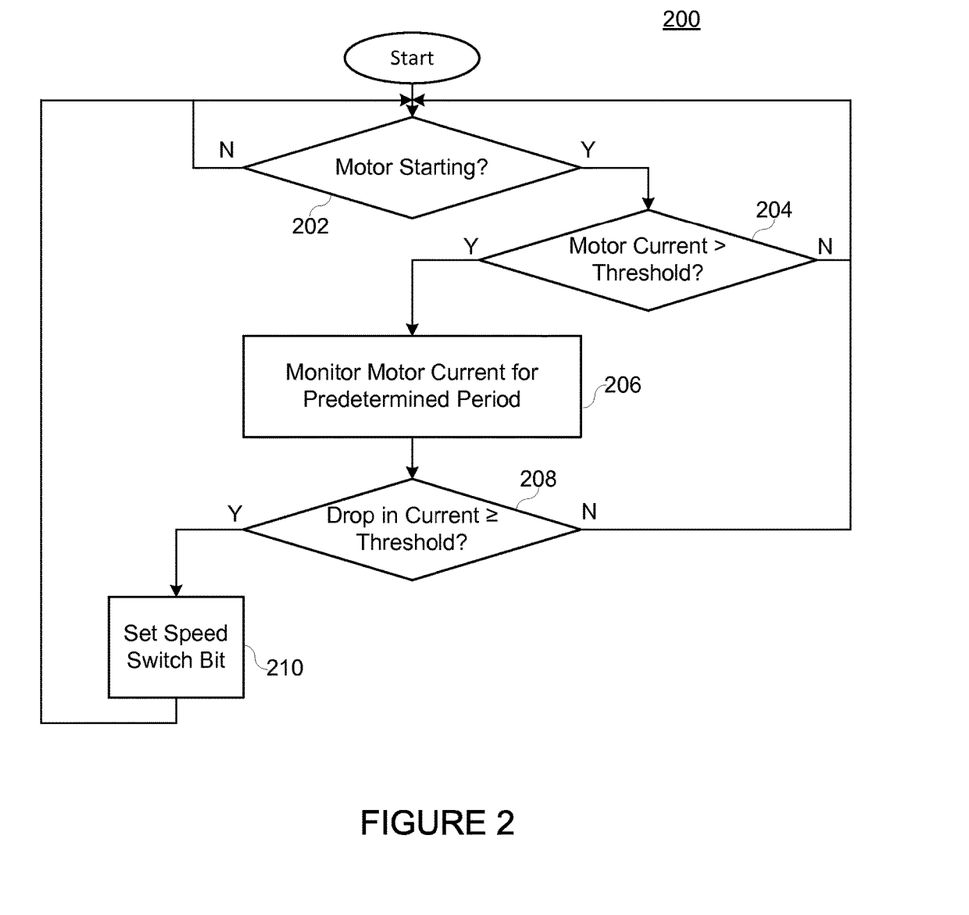
FIG. 2 illustrates a method of determining a locked rotor condition of a rotor of an electric motor according to several embodiments herein.

FIG. 2 illustrates a block diagram of a method 200 for providing a virtual speed switch signal, such as signal 182, which can be used in determining a locked rotor condition of an electric motor during startup. The method 200 starts with a determination of whether the motor is in a starting state 202. If the motor is not in a starting state, the method returns to start. If the motor is in a starting state, the method continues to determine whether the motor current is greater than a predetermined threshold 204 such as a motor current starting threshold. The motor current may be measured in absolute terms or in per-unit of full load current. As indicated above, during startup, the motor current will be much greater than the rated motor full load current. Thus, in one embodiment, the threshold may be from around 1.5 to around 6 times the rated load current. In one particular embodiment, the threshold may be around 2.5 times the rated load current. If the motor current is not greater than the predetermined threshold, then the method returns to start.

If, however, the motor current is greater than the predetermined threshold 204, then the method continues to monitor the motor current for a predetermined period 206. The period may be in power system cycles, processing cycles, time, or the like. If, after the predetermined period, the drop in current is greater than or equal to a drop threshold 208, then the method sets the speed switch bit 210, or outputs a speed switch output, such as signal 184, and returning to start. The output 210 may be a determination of rotor speed in that if the drop in current is greater than or equal to a drop threshold, then the rotor is determined to be rotating. Otherwise, the method does not set the bit and returns to start. Steps 206 through 210 monitor the motor current to be sure that it is dropping at a predetermined rate. The monitoring period and the drop threshold may be selected to ensure that the motor current is decreasing at least as rapidly as expected. The predetermined period may be selected as the time expected for the current to drop by the predetermined amount. In one embodiment, the predetermined period is selected as the time expected for the current to drop by 5% from the initial current during startup; thus the threshold is 5%.

In one specific embodiment, the steps of monitoring the motor current for a predetermined period 206 and determining whether the drop in current is greater than or equal to a threshold 208 includes monitoring the current from the initial current during startup for a drop in current.

In another specific embodiment, the steps of monitoring the motor current for a predetermined period 206 and determining whether the drop in current is greater than or equal to a threshold 208 includes monitoring the highest current during the monitoring step for a drop that is greater than or equal to the predetermined threshold.

In some embodiments, the rate of decrease of the motor current may be monitored and when the rate of decrease is greater than a predetermined threshold, the method may output the speed switch signal or set the speed switch 210. As used herein, setting the speed switch bit may be one way to output the speed switch signal.

Thus, following the method illustrated in FIG. 2, the embodiments described herein may provide a virtual speed switch signal using current signals from the motor. In certain embodiments, the virtual speed switch signal may be provided without use of a physical speed switch. In certain embodiments, the virtual speed switch signal may be provided without use of voltage signals from the motor.

Figure 3:
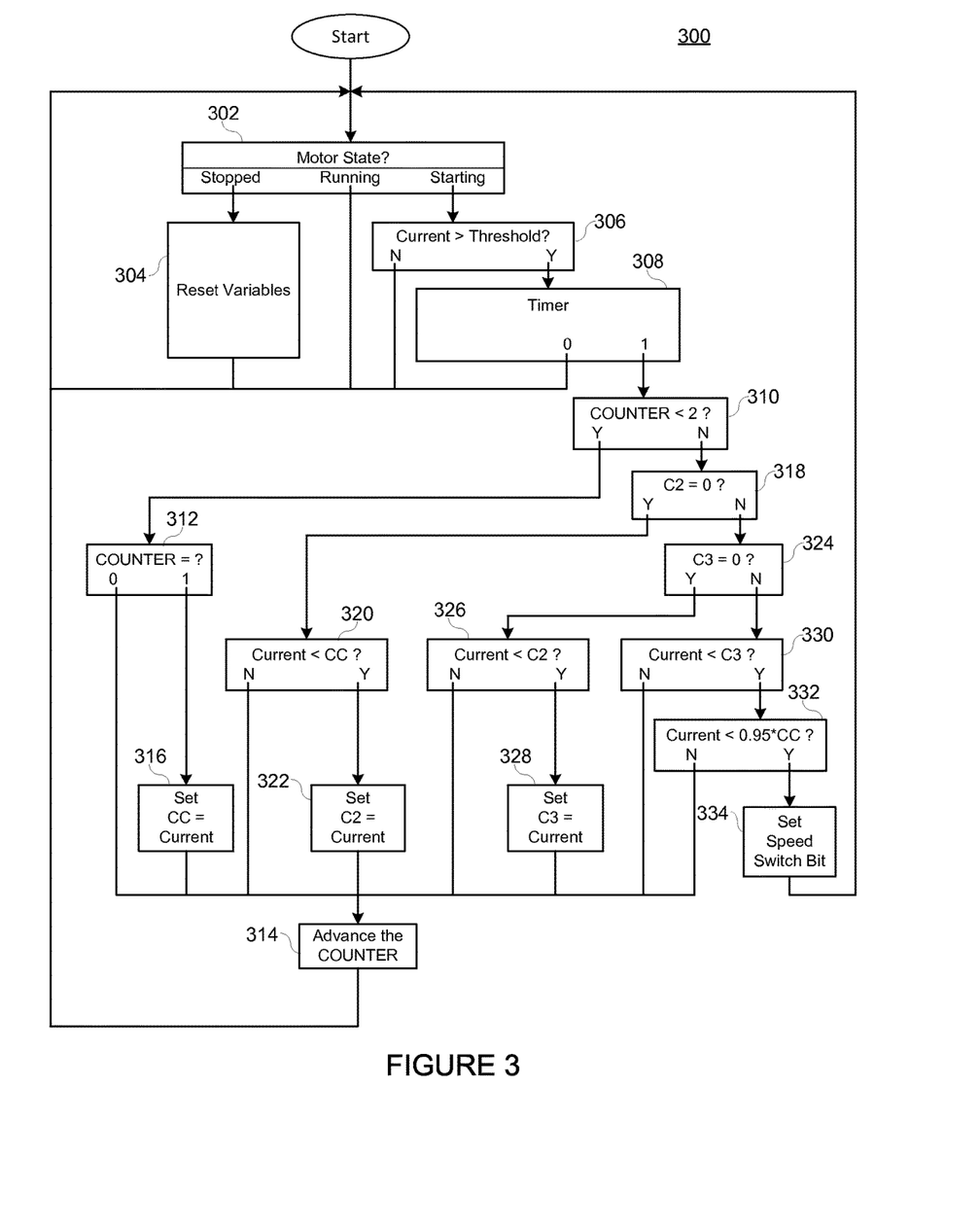
FIG. 3 illustrates another method of determining a locked rotor condition of a rotor of an electric motor according to several embodiments herein.

FIG. 3 illustrates another embodiment of a method 300 for providing a speed switch signal such as a virtual speed switch signal using current inputs. It should be noted that the method 300 may be configured to operate on a schedule. In one embodiment, the method 300 runs four times per power system cycle. The method 300 starts with a determination 302 of the state of the motor. This step determines whether the motor is in a stopped state, a running state, or a starting state. This determination may be made based on current to the motor. For example, when the current to the motor is below a certain predetermined stopped threshold (much less than the full-load current value), the motor may be in stopped state. If the current is less than a starting current threshold but greater than the stopped threshold, then the motor may be in starting state. If the current is greater than a starting threshold, then the motor may be in starting state. The state may be determined based on a command given to the motor. For example, if a command is given to start, the motor may be determined to be in starting state. Various other methods of determining the state of the motor may be used. If the motor is in a stopped state, the method resets all variables 304 used to determine the virtual speed switch signal, and returns to start. If, however, the motor is in a running state, the method simply returns to start.

If, however, the motor is in a starting state, the method continues to determine whether the sensed current is greater than a predetermined threshold 306. The current and the threshold may be in per unit of the rated full load current of the motor. As described in conjunction with FIG. 2, the threshold may be in multiples of the rated full load current such as, for example, from around 1.5 to around 6 times the rated full load current of the motor. In one embodiment, the threshold is around 2.5 times the rated full load current of the motor. If the current is not greater than the threshold, then the method returns to start.

If, however, the current is greater than the threshold 306, then the method continues to a timer step 308. The timer step may be configured to delay the method for predetermined periods. In one embodiment, the timer step 308 may output a timer bit 1 after expiration of a predetermined period, and a zero otherwise. The predetermined period may be from around 0.1 second to 1.0 second. The predetermined period may be 0.5 seconds. In another embodiment, the timer 308 step may output a pulse of timer=1 on a predetermined schedule, such as, for example, a ¼ electric power system cycle pulse each 0.5 seconds. If the output of timer is a zero, then the method returns to step 302. Otherwise, if the timer output is one, then the method continues to step 310. The timer step 308 may be implemented such that the process runs once every predetermined period. For example, in one embodiment, the timer step 308 allows the method to run every 0.5 seconds. The initial 0.5 second period of not running the method may allow for override during a sub-transient period during the initial startup of the motor.

At step 310, the method determines if a counter is less than 2. If the counter is less than 2, then the method continues to determine if the counter is at zero or one 312. If the counter is at zero, then the method continues to advance the counter 314 and returns to determine the motor state 302 (whether the motor is in a stopped state, running state or starting state). If, however, the counter at 312 is one, then the method continues to set a comparative current value ("CC") to the presently-detected current value 316 (which may be the current value from the determination of whether the current was greater than a predetermined threshold 306). The comparative current value may then be a comparative motor load current calculated from the current signal. Once the CC value is set to the present current value 316, the method advances the counter 314 and returns to determine the motor state 302.

Once the counter is not less than 2 in step 310, then the method continues to determine if the value for a second comparative current value ("C2") is equal to zero 318. The second comparative current value may be a subsequent motor load current. If the C2 value has not yet been stored, then it is equal to zero. If the C2 value is equal to zero 318, then the method continues to determine if the present current is less than the CC value 320. If the present current is not less than CC 320, then the method continues to advance the counter 314 and returns to determine the motor state 302. If, however, the present current is less than CC 320, then the method sets C2 to the present current 322, continues to advance the counter 314, and returns to determining the motor state 302.

Returning now to step 318, if C2 is not equal to zero, then the method continues to determine if a third comparative current value C3 (another subsequent motor load current) is equal to zero 324. Once again, if the C3 value has not yet been stored, then it is equal to zero. If the C3 value is equal to zero 318, then the method continues to determine if the present current is less than C2 326. If the present current is not less than C2 326, then the method continues to advance the counter 314 and returns to determining the state of the motor 302. If, however, the present current is less than C2 326, then the method proceeds to set C3 equal to the present current 328, advances the counter 314, and returns to determining the motor state 302.

Returning now to step 324, if C3 is not equal to zero, then the method continues to determine if the present current is less than C3 330. If the present current is not less than C3 in 330, then the method continues to advance the counter 314, and returns to determining the state of the motor 302. If, however the present current is less than C3 in 330, then the method determines whether the present current is less than a threshold 332. In one embodiment, the predetermined threshold may be calculated using the CC value from step 316. The threshold may be a product of a setting and the CC value. For example, the threshold may be from around 50% to around 99% of CC. In one particular embodiment, the threshold may be 95% of CC. If the present current is less not than the threshold 332, then the method advances the counter 314, and returns to determining the state of the motor 302. If, however, the present current is less than the threshold, then the method continues to set the speed switch bit 334, and returns to determining the motor state 302. The speed switch bit 334 may be a determination of rotor speed in that if the present current is less than the threshold, then the rotor is determined to be rotating. Thus, the rotor is determined to have a speed. In certain embodiments, if the present current is less than the threshold then the rotor is determined to have a rotor rotation.

Method 300, therefore, only sets the speed switch bit (which may be a virtual speed switch bit in that the bit does not originate from a physical speed switch) once the present current value falls below a predetermined portion of a comparative motor current measured previous to the present current value. The predetermined portion may be a setting, which may be derived from a tolerance in motor starting current measurements for the particular hardware platform used to implement the method. To tailor the method for the particular platform, a user may shorten or lengthen the time delay in step 308. Furthermore, to tailor the method for the particular platform, the predetermined portion of the comparative current may be modified for the particular platform.

Figure 4A:
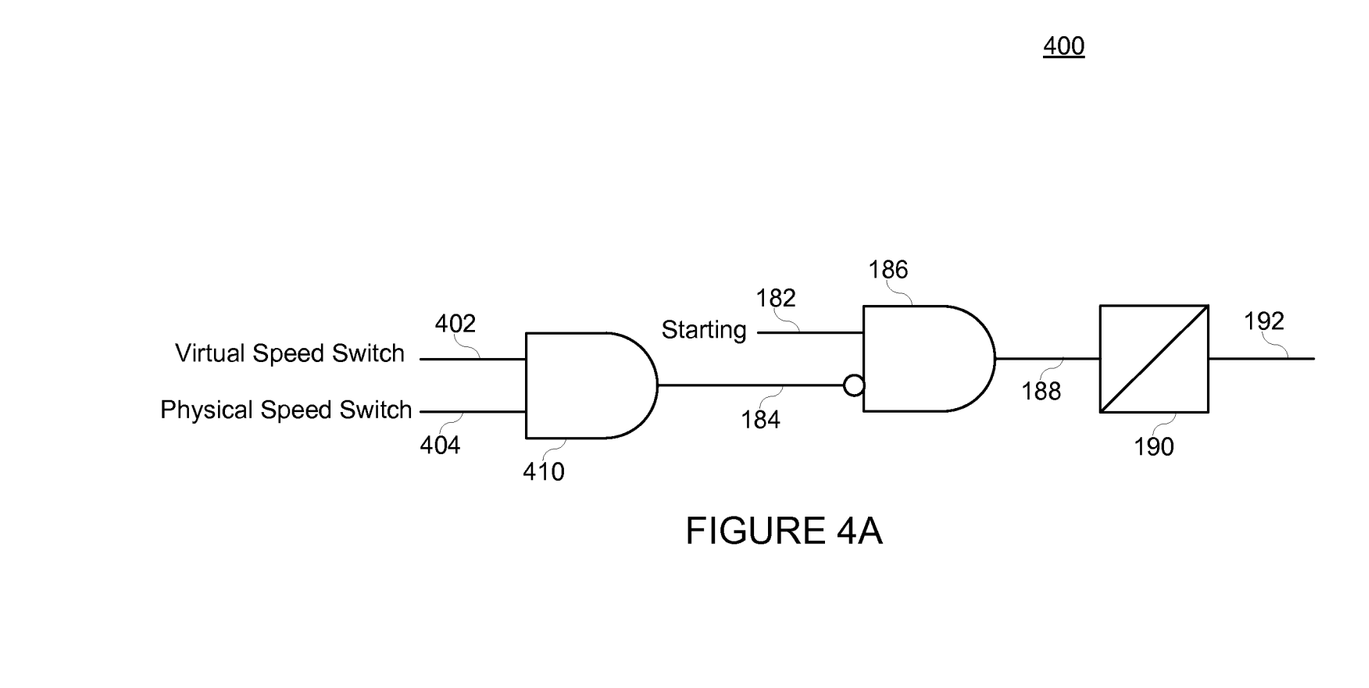
FIG. 4A illustrates a simplified logic diagram for detecting a locked rotor condition using virtual and physical speed switch signals.
Figure 4B:
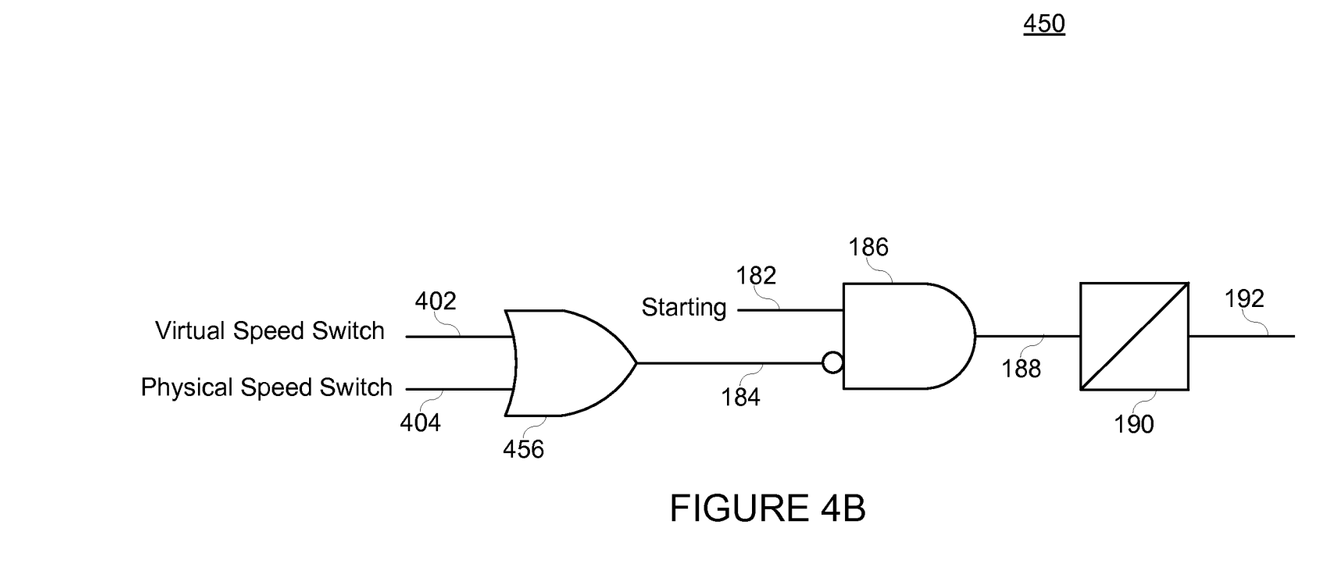
FIG. 4B illustrates a simplified logic diagram for detecting a locked rotor condition using virtual and physical speed switch signals.

In some embodiments, a virtual speed switch signal may be used in parallel with a physical speed switch signal. FIGS. 4A and 4B illustrate logic diagrams that may be used in protection of an electrical motor using outputs from a virtual speed switch and a physical speed switch. In some embodiments, it may be desired to bias the system for either security or dependability of the locked rotor output. Thus, both a virtual speed switch signal as described in more detail hereinabove and a physical speed switch signal may be used to determine a locked rotor condition.

Specifically, FIG. 4A illustrates a simplified logic diagram 400 for a system that is biased toward dependability, in that if either or both of the physical or virtual speed switch signals are absent, a locked rotor condition may be declared.

System 400 includes a physical speed switch signal 404, which may originate from a physical speed switch, and a virtual speed switch signal 402. The virtual speed switch signal 402 may be provided using the embodiments described herein. As used herein, a speed switch signal is present when the speed switch (physical or virtual) detects that the rotor is spinning. Both signals 402 and 404 are provided to AND gate 410. Only when both speed switch signals 402 and 404 are present will AND gate 410 output the speed switch signal 184. Speed switch signal 184 may be used similarly to the logic in FIG. 1C to provide a locked rotor signal 192. That is, an inverted speed switch signal 184 and a starting signal 182 may be provided to AND gate 186. If the starting signal 182 is present and the speed switch signal 184 is not present, then AND gate 186 outputs a locked rotor signal 188. The locked rotor signal 188 may be input to timer 190, which may require that the signal be present for the predetermined time $t_V$ 158 (FIG. 1B). If the signal 188 persists for the predetermined time $t_V$, then a locked rotor signal 192 may be output from the timer 190.

FIG. 4B illustrates a simplified logic diagram 450 used in a system that is biased toward security, in that only if both of the physical and virtual speed switch signals 402 or 404 are absent a locked rotor condition may be declared. System 400 includes a physical speed switch signal 404 and a virtual speed switch signal 402. The virtual speed switch signal may be provided using the embodiments described herein. Both speed switch signals 402 and 404 are provided to OR gate 456. If either or both of the physical speed switch signal 404 and the virtual speed switch signal 402 are present, then the OR gate 456 outputs a speed switch signal 184. Speed switch signal 184 may be used similarly to the logic in FIG. 1C to provide a locked rotor signal 192. That is, an inverted speed switch signal 184 and a starting signal 182 may be provided to AND gate 186. If the starting signal 182 is present and the speed switch signal 184 is not present, then AND gate 186 outputs a locked rotor signal 188. The locked rotor signal 188 may be input to timer 190, which may require that the signal be present for the predetermined time $t_V$ 158 (FIG. 1B). If the signal 188 persists for the predetermined time $t_V$, then a locked rotor signal 192 may be output from the timer 190.

Figure 5A:
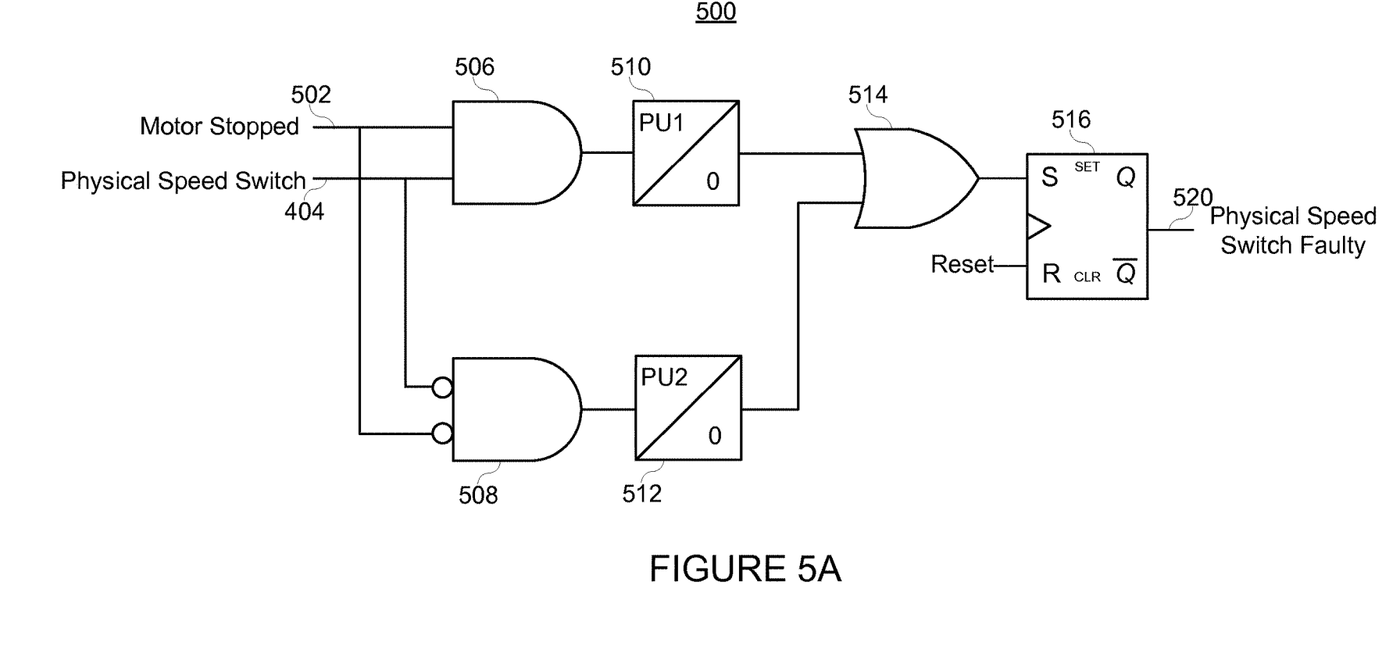
FIG. 5A illustrates a simplified logic diagram for detecting a faulty physical speed switch.

FIG. 5A illustrates a simplified logic diagram 500 of a system for determining whether a physical speed switch is faulty. A physical speed switch signal 404 which may be obtained from a physical speed switch as further discussed herein and a motor stopped signal 502 may be provided to AND gates 506 and 508. The motor stopped signal 502 may be provided using the current signals obtained from the electric motor. In certain embodiments, the motor stopped signal 502 may be asserted when the current to the motor is less than a stopped motor current threshold. The stopped motor current threshold may be a current corresponding with a motor no-load current. In other embodiments, the motor stopped current threshold may be much less than the current corresponding with a motor no-load current. In some embodiments, the motor stopped current threshold may be near zero. If both the motor stopped signal 502 is enabled and a physical speed switch signal 404 is enabled (indicating that the motor is indeed spinning), then AND gate 506 enables timer 510 with a pickup value of PU1. The pickup value of PU1 may be greater than the maximum coasting time of the motor. Accordingly, if both the motor stopped signal 502 and the physical speed switch signal 404 are enabled for a time period longer than the maximum coasting time of the motor, then the timer 510 outputs a signal to OR gate 514 indicating that the physical speed switch is faulty.

In parallel with AND gate 506, the motor stopped signal 502 and the physical speed switch signal 404 are inverted to AND gate 508. If both the motor stopped signal 502 is absent, and the physical speed switch 404 is absent, then AND gate 508 enables timer 512 with a pickup value of PU2. Pickup value PU2 may be greater than the operate time of the switch (such as timer 190 of FIG. 1C). It should be noted that if the motor is in a starting state (current is being supplied to the motor, thus the motor stopped signal 502 should not be enabled) and the physical speed switch signal 404 is absent, then the motor should be tripped off (current removed from the motor) upon lapse of timer 190. Thus, if the current continues to be supplied to the motor (motor stopped signal 502 is not enabled) after expiration of the timer 190, then the motor must be turning, and the physical speed switch is faulty for continuing to provide no output. If the signal from AND gate 508 persists for a time longer than the pickup value of timer 512, then a signal is provided to OR gate 514 indicating that the physical speed switch is faulty. The OR gate 514 signals a manual reset 516 that the speed switch is faulty, and manual reset 516 provides the physical speed switch faulty signal 520 until a manual resent occurs. In certain embodiments the manual reset is not used, and the OR gate 514 outputs the physical speed switch faulty signal 520.

Thus, the simplified logic of FIG. 5A outputs a physical speed switch faulty signal 520 when either the motor stopped signal 502 and the physical speed switch signal 404 are both present for a first predetermined time, or both absent for a second predetermined time. The first predetermined time may correspond with a maximum coasting time of the motor. The second predetermined time may correspond with a speed switch operate time.

Figure 5B:
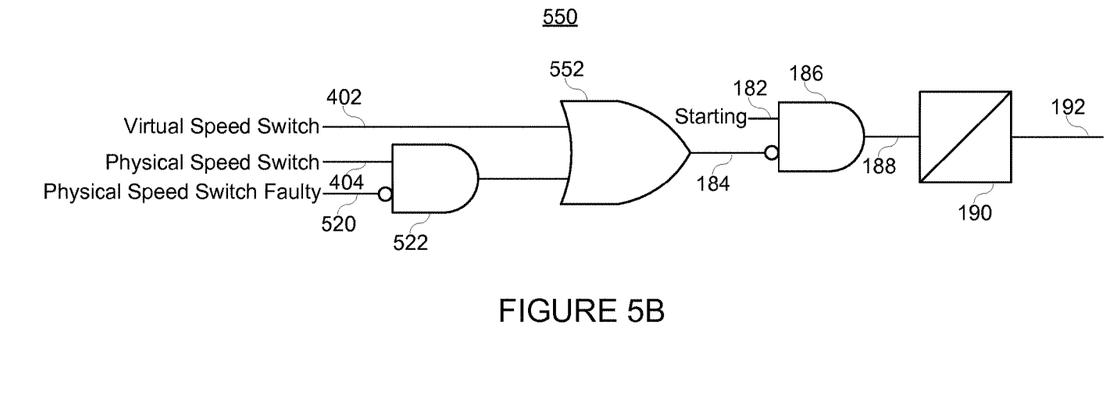
FIG. 5B illustrates a simplified logic diagram for detecting a locked rotor condition using virtual and physical speed switch signals.
Figure 5C:
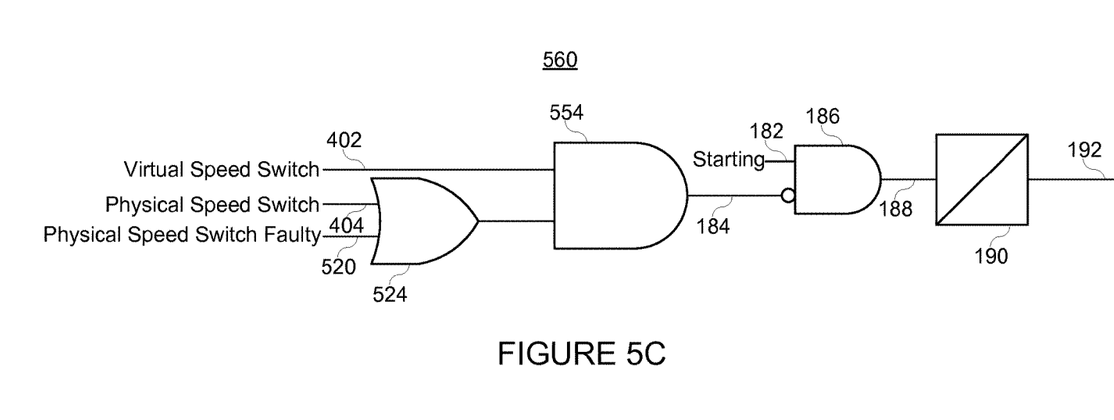
FIG. 5C illustrates a simplified logic diagram for detecting a locked rotor condition using virtual and physical speed switch signals.

FIGS. 5B and 5C illustrate simplified logic diagrams for determining a locked rotor condition of an electric motor using a virtual speed switch and a physical speed switch, and a determination as to whether the physical speed switch is faulty. Specifically, FIG. 5A indicates a logic 550 wherein either a virtual speed switch signal 402 or a physical speed switch signal 404 may be used to determine a locked rotor condition 192, but the physical speed switch signal 404 may only be used if it is not determined to be faulty (the physical speed switch faulty signal 520 is absent). In particular, the logic 550 includes an AND gate 522 which signals OR gate 552 when both the physical speed switch signal 404 is enabled and the physical speed switch faulty signal 520 is absent. When either the signal from AND gate 522 or the virtual speed switch signal 402 is present, OR gate 552 outputs a speed switch signal 184. When the speed switch signal 184 is not present and the starting signal 182 is present, then AND gate 186 outputs signal 188 to timer 190. Timer 190 requires the signal 188 to be present for the predetermined time before outputting a locked rotor signal 192. An IED may then take a protective action or alarm upon the locked rotor signal 192. As described herein, the protective action may include tripping the motor by opening a circuit breaker or switch, thus removing the supply of current to the motor.

FIG. 5C illustrates a logic 560 wherein both a virtual speed switch signal 402 and either a physical speed switch signal 404 or an indication that the physical speed switch is faulty (physical speed switch faulty signal 520) must be present to determine that the motor is not in a locked rotor condition 192. In particular, OR gate 524 provides a signal if either the physical speed switch signal 404 is present or the physical speed switch faulty signal 520 is present. AND gate 554 provides a speed switch signal 184 when both: 1)

the virtual speed switch signal 402 is present; and, 2) either the physical speed switch 404 signal is present or the physical speed switch faulty 520 signal is present. The AND gate 186 may output a signal 188 when both the starting bit 182 is set and the speed switch 184 is not set, indicating that the motor is starting, but the rotor is not turning. The signal 188 may be input to a timer 190, which requires that the signal be present for the predetermined time. If the signal 188 persists for the predetermined time, then a locked rotor signal 192 may be output from the timer 190. An IED with a locked rotor module such as the logic 180 may signal the circuit breakers feeding the motor to open upon issuance of the locked rotor signal 192, thus removing power from the motor.

Figure 6:
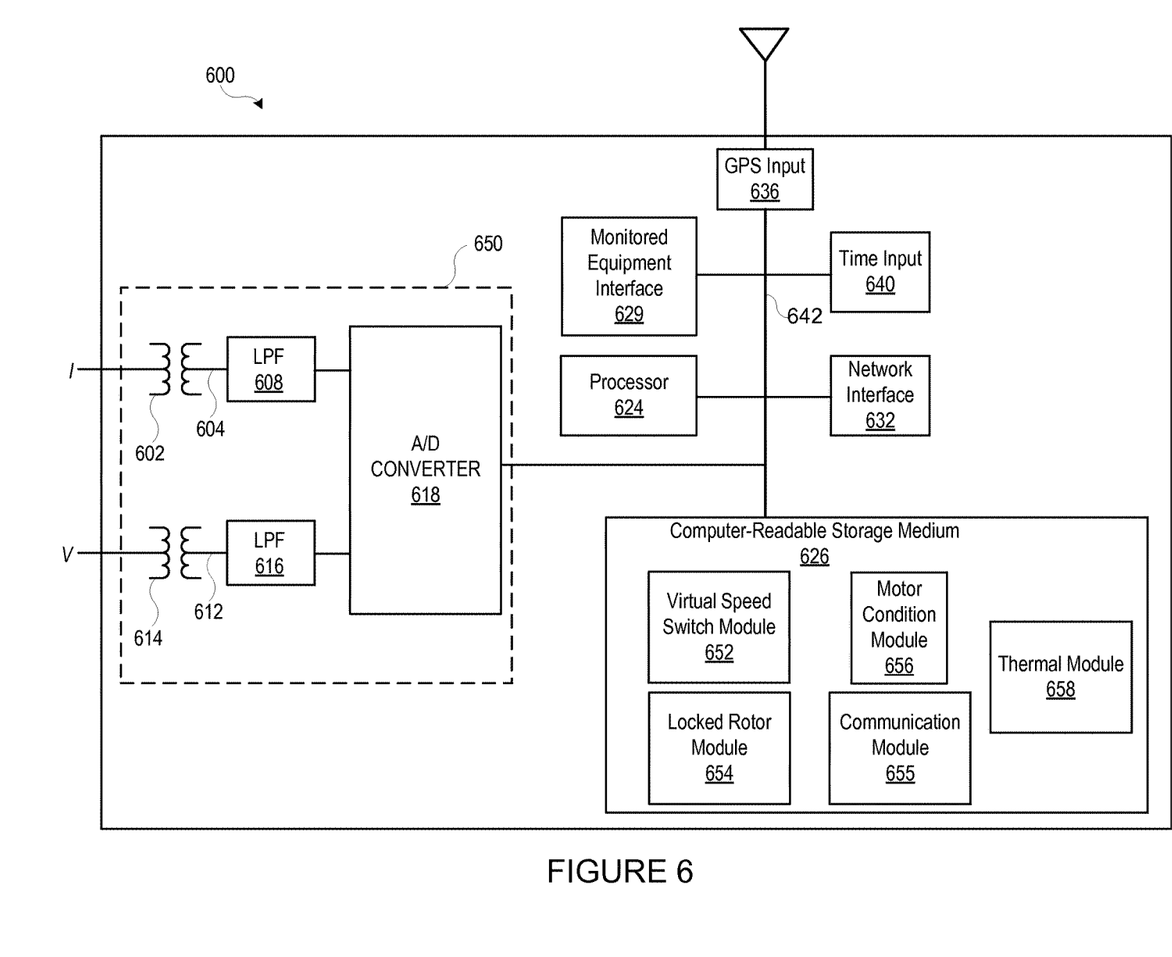
FIG. 6 illustrates a functional block diagram of an intelligent electronic device ("IED") for electric motor protection using a virtual speed switch according to several embodiments herein.

FIG. 6 illustrates an exemplary block diagram of an IED 600 configured to monitor an electrical motor consistent with embodiments disclosed herein. IED 600 is illustrated with several modules and interfaces that may not be needed for each of the embodiments described herein. For example, IED 600 may include a network interface 632 configured to communicate with a data network. IED 600 also may include a time input 640, which may be used to receive a time signal. In certain embodiments, time input 640 may be used to generate a reference signal. In certain embodiments, a common time reference may be received via network interface 632, and accordingly, a separate time input and/or GPS input 636 would not be necessary. One such embodiment may employ the IEEE 1588 protocol. Alternatively, a GPS input 636 may be provided in addition or instead of a time input 640.

A monitored equipment interface 629 may be configured to receive status information from, and issue control instructions to a piece of monitored equipment, such as an electrical motor. According to certain embodiments, the monitored equipment interface 629 may be configured to interface with circuit breakers, speed switches, or other such inputs or outputs from an electrical motor.

A computer-readable storage medium 626 may be the repository of one or more modules and/or executable instructions configured to implement any of the processes described herein. A data bus 642 may link monitored equipment interface 629, time input 640, network interface 632, GPS input 636, and computer-readable storage medium 626 to a processor 624.

Processor 624 may be configured to process communications received via network interface 632, time input 640, GPS input 636, and monitored equipment interface 629. Processor 624 may operate using any number of processing rates and architectures. Processor 624 may be configured to perform various algorithms and calculations described herein using computer executable instructions stored on computer-readable storage medium 626. Processor 624 may be embodied as a general purpose integrated circuit, an application specific integrated circuit, a field-programmable gate array, and other programmable logic devices.

In certain embodiments, IED 600 may include a sensor component 650. In the illustrated embodiment, sensor component 650 is configured to gather data directly from a conductor (not shown) using a current transformer 602 and/or a voltage transformer 614. Voltage transformer 614 may be configured to step-down the power system's voltage (V) to a secondary voltage waveform 612 having a magnitude that can be readily monitored and measured by IED 600. Similarly, current transformer 602 may be configured to proportionally step-down the power system's line current (I) to a secondary current waveform 604 having a magnitude that can be readily monitored and measured by IED 600.

Low pass filters 608, 616 respectively filter the secondary current waveform 604 and the secondary voltage waveform 612. An analog-to-digital converter 618 may multiplex, sample and/or digitize the filtered waveforms to form corresponding digitized current and voltage signals.

In several embodiments herein, a voltage signal from the electric motor may not be available. Thus, the voltage transformer 614 and low pass filter 616 may be absent from certain embodiments herein.

As described above, certain embodiments may monitor an electric motor for a locked rotor condition during startup using current signals from the electric motor. Sensor component 650 may be configured to obtain the necessary current signals for such protection. Further, sensor component 650 may be configured to monitor a wide range of characteristics associated with monitored equipment, including equipment status, temperature, frequency, pressure, density, infrared absorption, radio-frequency information, partial pressures, viscosity, speed, rotational velocity, mass, switch status, valve status, circuit breaker status, tap status, meter readings, and the like.

A/D converter 618 may be connected to processor 624 by way of a bus 642, through which digitized representations of current and voltage signals may be transmitted to processor 624. In various embodiments, the digitized current and voltage signals may be compared against conditions. For example, certain conditions may be established in order to implement one or more control actions based upon a determination that a locked rotor condition exists. The control action may include an instruction to remove electric power to the motor by, for example, opening a circuit breaker, opening a switch, or the like.

A monitored equipment interface 629 may be configured to receive status information from, and issue control instructions to a piece of monitored equipment. As discussed above, control actions may be issued when a locked rotor condition is detected. Monitored equipment interface 629 may be configured to issue control instructions to one or more pieces of monitored equipment. According to some embodiments, control instructions may also be issued via network interface 632. Control instructions issued via network interface 632 may be transmitted, for example, to other IEDs (not shown), which in turn may issue the control instruction to a piece of monitored equipment. Alternatively, the piece of monitored equipment may receive the control instruction directly via its own network interface. For example, the control instructions may be in response to a locked rotor determination, to disconnect power from the electric motor. The control instructions may, therefore, be a trip signal to a circuit breaker to open and, thus, disconnect the electric motor from its power supply.

Computer-readable storage medium 626 may be the repository of one or more modules and/or executable instructions configured to implement certain functions described herein. The Computer-readable storage medium 626 may include a motor condition module 656. The motor condition module may be configured to determine a motor state, such as, for example, a starting state, a running state, and a stopped state. The motor condition module 656 may use current inputs, and/or inputs from the network interface or a user interface to determine a motor condition. For example, a user may start the motor by entering a start command using a user interface. Motor condition module 656 may determine that the motor is starting using the information from the starting command as well as a current signal from the sensor component 650 which indicates that current is being supplied to the motor. Similarly, the motor condition module 656 may determine that the motor is in stopped condition using the current signals from sensor component 650 and/or inputs from the user interface. Furthermore, the motor condition module 656 may determine that the motor is in a running condition using the current signals from sensor component 650 when the current signals correspond with a running state. That is, when the current signals are at or around the full load current 156 illustrated in FIG. 1B, the motor condition module 656 may determine that the motor is in a running state.

Virtual speed switch module 652 may be configured to calculate a virtual speed switch signal using electrical data from the sensor component 650, such as, for example, current signals from the electric motor as discussed herein. The virtual speed switch module may use methods such as those discussed in conjunction with FIGS. 2 and 3 herein to determine a speed switch output. Virtual speed switch module 652 may further use a motor condition signal from the motor condition module 656. The virtual speed switch module 652 may determine a virtual speed switch output when the motor is in a starting state, as discussed in more detail in conjunction with FIGS. 1C, 2, and 3.

Locked rotor module 654 may be configured to determine a locked rotor condition according to several embodiments disclosed herein. The locked rotor module 654 may use a virtual speed switch signal such as may be provided from the virtual speed switch module 652. The locked rotor module may further use the output from the motor condition module 656 to determine a locked rotor state of the motor. The locked rotor module 654 may also use a speed switch signal from a physical speed switch to determine a locked rotor condition according to several embodiments herein. The locked rotor module may determine a locked rotor condition using only a virtual speed switch signal from virtual speed switch module 652. The locked rotor module may determine a locked rotor condition using only a physical speed switch signal from a physical speed switch. The locked rotor module may determine a locked rotor condition using both a virtual speed switch signal from virtual speed switch module 652 and a physical speed switch signal from a physical speed switch following, for example, FIG. 4A or 4B herein. The locked rotor module may determine whether a physical speed switch is faulty according to FIG. 5A herein. The locked rotor module may determine a locked rotor condition using a virtual speed switch signal from virtual speed switch module 652, a physical speed switch signal, and a physical speed switch faulty signal, using, for example, FIG. 5B or 5C herein. The locked rotor module may be generally referred to herein as a protection module.

Communication module 655 may facilitate communication between IED 600 and other IEDs (not shown) via network interface 632. In addition, communication module 655 may further facilitate communication with monitored equipment in communication with IED 600 via monitored equipment interface 629 or with monitored equipment in communication with IED 600 via network interface 632. For example, when the locked rotor module determines that a locked rotor condition exists, the communication module may signal the monitored equipment interface 629 to take a protective action such as disconnecting the electric motor from its power source.

Computer-readable storage medium 626 may further include a thermal module 658 configured to determine whether a thermal limit of the motor has been reached. During startup, the thermal module 658 may use current and/or voltage inputs to determine a thermal state of the stator and/or rotor of the motor. For example, the thermal module 658 may determine whether the temperature of the rotor of the motor exceeds a predetermined thermal threshold by calculating a thermal value of the rotor and comparing the thermal value against a predetermined threshold. The thermal value of the rotor may be calculated using current measurements from the rotor and the resistance of the rotor. As resistance is a function of the slip of the rotor, and slip may be calculated using current measurements, the thermal module 658 may be configured to use current values from the motor to determine a thermal condition of the rotor. A locked rotor condition would result in a high slip value, which would in turn result in a high determined thermal value for the rotor. Thus, a locked rotor condition may be detected by the thermal module 658.

In several embodiments herein, the thermal module 658, the virtual speed switch module 652, and the locked rotor module 654 may be configured to function in parallel. Thus, the motor may be protected from locked rotor conditions using both the locked rotor module 654 and the thermal module 658. The IED 600 may be biased toward security or reliability. For example, the IED 600 may be configured to trip the motor only if both the thermal module 658 and the locked rotor module 654 determine that the rotor is locked. Alternatively, the IED 600 may be configured to trip the motor if either the thermal module 658 or the locked rotor module 654 determine that the rotor is locked. Furthermore, the locked rotor module 654 and/or the thermal module 658 may be configured to enter a state of heightened security if the other of the locked rotor module 654 and the thermal module 658 indicate a locked rotor or thermal condition of the motor. The locked rotor module 654 and/or the thermal module 658 may be configured to modify thresholds or other settings of the thermal module 658, locked rotor module 654 or other modules upon detection of a locked rotor indication from the locked rotor module 654 or the thermal module 658.

While specific embodiments and applications of the disclosure have been illustrated and described, it is to be understood that the disclosure is not limited to the precise configurations and components disclosed herein. Accordingly, many changes may be made to the details of the above-described embodiments without departing from the underlying principles of this disclosure. The scope of the present invention should, therefore, be determined only by the following claims.

What is claimed is:

1. An apparatus for monitoring and protecting an electric motor using a virtual speed switch bit, the apparatus comprising:
a sensor component in electrical communication with the electric motor for obtaining an electrical signal from the electric motor and providing a current signal representative of a current to the electric motor;
a processor in communication with the sensor component;
a computer-readable storage medium in communication with the processor comprising computer instructions for execution on the processor, the instructions comprising:
a virtual speed switch module configured to:
calculate a motor state using the current signal representing current to the motor;
when the motor is in a starting state:
calculate a comparative motor load current from the current signal;
determine whether the comparative motor load current is greater than a predetermined starting current threshold;

when the comparative motor load current is greater than the predetermined starting current threshold, determine whether a shaft of the motor is rotating based on a current drop rate calculated by:
waiting a predetermined period;
after the predetermined period, calculating a subsequent motor load current from the current signal;
determining whether the subsequent motor load current is less than the comparative motor load current; and,
when the subsequent motor load current is less than the comparative motor load current after the predetermined period, set a virtual speed switch bit to indicate that the shaft of the motor is rotating; and
a locked rotor module configured to receive current signal and determine a locked rotor condition of the motor using the current signal and the virtual speed switch bit.

2. An apparatus for monitoring and protecting an electric motor, comprising:
a virtual speed switch module configured to:
receive electric motor current signals from a current sensor;
calculate a motor state using the current signals;
when the motor is in a starting state:
calculate a comparative motor load current from the current signals;
determine whether the comparative motor load current is greater than a predetermined starting current threshold;
when the comparative motor load current is greater than the predetermined starting current threshold, wait a predetermined period;
after the predetermined period, calculate a subsequent motor load current from the current signals;
determine whether the subsequent motor load current is less than the comparative motor load current; and,
output a determination of rotor speed when the subsequent motor load current is less than the comparative motor load current after the predetermined period; and
a protection module in electrical communication with the virtual speed switch module, configured to determine a locked rotor condition of the motor based on the determination of rotor speed.

3. The apparatus of claim 2, wherein the protection module further determines a locked rotor condition using the motor state.

4. The apparatus of claim 3, wherein the virtual speed switch module is further configured when the motor is in a starting state to:
calculate a second motor load current after calculation of the comparative motor load current;
compare the second motor load current with the comparative motor load current; and,
when the second motor load current is less than the comparative motor load current, set the subsequent motor load current equal to the second motor load current.

5. The apparatus of claim 4, wherein the virtual speed switch module is further configured when the motor is in a starting state to:
calculate a third motor load current after calculation of the second motor load current;
compare the third motor load current with the comparative motor load current; and,
when the third motor load current is less than the comparative motor load current, set the subsequent motor load current equal to the third motor load current.

6. The apparatus of claim 2, wherein the virtual speed switch module is further configured when the motor is in a starting state to wait a predetermined period after the motor initiates a start before calculating the comparative motor load current.

7. The apparatus of claim 2, wherein the virtual speed switch module is further configured when the motor is in a starting state to determine when the subsequent motor load current is less than a predetermined portion of the motor load current, and when the subsequent motor load current is less than the predetermined portion of the motor load current, output a determination of rotor speed.

8. The apparatus of claim 2, wherein the protection module is configured to determine the locked rotor condition when:
the motor is in a starting state; and
the output of the virtual speed switch module does not indicate rotor rotation.

9. The apparatus of claim 2, further comprising an overcurrent element module coordinated with the protection module such that the overcurrent module does not issue a trip command during startup.

10. The apparatus of claim 2, further comprising a thermal module configured to determine whether a thermal threshold of the motor has been reached, wherein the protection module is configured to determine a locked rotor condition independent of the thermal module.

11. The apparatus of claim 2, wherein the protection module further determines a locked rotor condition based on an input from a physical speed switch.

12. The apparatus of claim 11, wherein the protection module further determines whether the physical speed switch is faulty, and determines a locked rotor condition based on whether the physical speed switch is faulty.

13. The apparatus of claim 12, wherein the protection module is configured to determine whether the physical speed switch is faulty using the current signals.

14. A method for detecting a locked rotor condition, comprising:
obtaining electrical signals from an electric motor;
calculating a load current of the electric motor from the electric signals;
determining a state of the motor;
when the motor is in a starting state:
calculate a comparative motor load current from the electrical signals;
determine whether the motor load current is greater than a predetermined starting current threshold;
when the comparative motor load current is greater than the predetermined starting current threshold, determine whether a shaft of the motor is rotating based on a current drop rate calculated by:
waiting a predetermined period;
after the predetermined period, calculating a subsequent motor load current from the electrical signals;
determining whether the subsequent motor load current is less than the comparative motor load current; and,
determining a locked rotor condition of the motor when the motor is in the starting state and the subsequent motor load current after the predetermined period is not less than the comparative motor load current.

15. The method of claim 14, further comprising:
calculating a second motor load current after calculation of the comparative motor load current;
comparing the second motor load current with the comparative motor load current; and,
setting the comparative motor load current equal to the second motor load current when the second motor load current is less than the comparative motor load current.

16. The method of claim 15, further comprising:
calculating a third motor load current after calculation of the second motor load current;
comparing the third motor load current with the comparative motor load current; and,
setting the comparative motor load current equal to the second motor load current when the third motor load current is less than the comparative motor load current.

17. The method of claim 14, further comprising determining that the rotor is in a locked rotor condition when the subsequent motor load current is not less than a predetermined portion of the motor load current.

18. A motor protection apparatus for detecting a locked rotor condition of an electric motor, comprising:
a sensor component in communication with an electric feed to the electric motor, configured to obtain current signals from the electric feed;
a virtual speed switch module in communication with the sensor component, and configured to:
calculate a comparative motor load current from the current signals;
determine whether the comparative motor load current is greater than a predetermined starting current threshold;
when the comparative motor load current is greater than the predetermined starting current threshold, determine whether a shaft of the motor is rotating based on a current drop rate calculated by:
wait a predetermined period;
after the predetermined period, calculate a subsequent motor load current from the current signals; and,
determine whether the subsequent motor load current is less than the comparative motor load current after the predetermined period; and
a locked rotor module configured to determine a locked rotor condition when the subsequent motor load current is not less than the comparative motor load current.

19. The motor protection apparatus of claim 18, wherein the locked rotor module is further configured to determine a locked rotor condition when the subsequent motor load current is not less than a predetermined portion of the comparative motor load current.

20. The motor protection apparatus of claim 18, wherein the locked rotor module is further configured to determine a locked rotor condition when an output from a physical speed switch is not received by the motor protection apparatus.

21. A motor protection apparatus for detecting a locked rotor condition of an electric motor, comprising:
a sensor component in communication with an electric feed to the electric motor, configured to obtain current signals from the electric feed;
a protection module in communication with the sensor component, and configured to:
calculate a load current to the electric motor from the current signals;
compare the load current to a predetermined stopped motor current threshold;
obtain a physical speed switch signal from a physical speed switch;
determine a state of the physical speed switch based on the comparison of the load current to the predetermined stopped motor current threshold and the physical speed switch signal;
obtain a virtual speed switch signal from a virtual speed switch module; and
determine a locked rotor condition using the virtual speed switch signal, physical speed switch signal, and the determined state of the physical speed switch.

* * * * *